(12) United States Patent
Savandaiah et al.

(10) Patent No.: US 11,600,477 B2
(45) Date of Patent: Mar. 7, 2023

(54) GAS INJECTION PROCESS KIT TO ELIMINATE ARCING AND IMPROVE UNIFORM GAS DISTRIBUTION FOR A PVD PROCESS

(71) Applicant: Applied Materials, Inc., Santa Clara, CA (US)

(72) Inventors: Kirankumar Neelasandra Savandaiah, Bangalore (IN); Shane Lavan, Santa Clara, CA (US); Sundarapandian Ramalinga Vijayalakshmi Reddy, Bangalore (IN); Randal Dean Schmieding, Los Gatos, CA (US); Yong Cao, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 55 days.

(21) Appl. No.: 17/121,603

(22) Filed: Dec. 14, 2020

(65) Prior Publication Data

US 2022/0186361 A1    Jun. 16, 2022

(51) Int. Cl.
*H01J 37/34* (2006.01)
*H01J 37/32* (2006.01)
*C23C 14/35* (2006.01)
*C23C 14/28* (2006.01)
*C23C 14/56* (2006.01)

(52) U.S. Cl.
CPC .......... *H01J 37/3441* (2013.01); *C23C 14/28* (2013.01); *C23C 14/35* (2013.01); *C23C 14/564* (2013.01); *H01J 37/32504* (2013.01); *H01J 37/3411* (2013.01); *H01J 37/3447* (2013.01); *H01J 37/3488* (2013.01)

(58) Field of Classification Search
CPC .................................................. H01J 37/3441
See application file for complete search history.

(56) References Cited

U.S. PATENT DOCUMENTS

| | | | | |
|---|---|---|---|---|
| 5,518,593 A | * | 5/1996 | Hosokawa | .......... C23C 14/3407 118/724 |
| 9,177,763 B2 | * | 11/2015 | Rasheed | .............. H01J 37/3244 |
| 9,464,349 B2 | * | 10/2016 | Hawrylchak | ....... C23C 16/4585 |

(Continued)

FOREIGN PATENT DOCUMENTS

JP     10-055983 A     2/1998

OTHER PUBLICATIONS

International Search Report for PCT/US2021/063354, dated Mar. 24, 2022.

*Primary Examiner* — John J Brayton
(74) *Attorney, Agent, or Firm* — Moser Taboada

(57) ABSTRACT

Embodiments of process shield for use in process chambers are provided herein. In some embodiments, a process shield for use in a process chamber includes: an annular body having an upper portion and a lower portion extending downward and radially inward from the upper portion, wherein the upper portion includes a plurality of annular trenches on an upper surface thereof and having a plurality of slots disposed therebetween to fluidly couple the plurality of annular trenches, wherein one or more inlets extend from an outer surface of the annular body to an outermost trench of the plurality of annular trenches.

19 Claims, 4 Drawing Sheets

(56) References Cited

U.S. PATENT DOCUMENTS

| | | | |
|---|---|---|---|
| 2007/0056845 A1* | 3/2007 | Ye | H01J 37/3441 |
| | | | 204/192.1 |
| 2013/0153412 A1* | 6/2013 | Ritchie | C23C 14/34 |
| | | | 204/298.11 |
| 2014/0261177 A1 | 9/2014 | Rasheed et al. | |
| 2014/0338601 A1* | 11/2014 | Choi | H01J 37/32541 |
| | | | 118/723 R |
| 2015/0075980 A1 | 3/2015 | Nguyen et al. | |
| 2016/0189938 A1 | 6/2016 | Savandalah et al. | |
| 2017/0076924 A1 | 3/2017 | Johanson et al. | |
| 2017/0098530 A1* | 4/2017 | Johanson | H01J 37/32651 |

\* cited by examiner

GAS INJECTION PROCESS KIT TO ELIMINATE ARCING AND IMPROVE UNIFORM GAS DISTRIBUTION FOR A PVD PROCESS

FIELD

Embodiments of the present disclosure generally relate to substrate processing equipment.

BACKGROUND

Plasma process chambers typically include a substrate support to support a substrate and a target disposed opposite the substrate support. The target provides a source of material for sputtering onto the substrate during processing. RF power is provided to the plasma process chamber to create a plasma in a processing volume disposed between the target and the substrate support. Plasma process chambers typically include process kits for protecting chamber walls from unwanted deposition and to confine the plasma. Process kits generally include a process shield. A space between the target and the process shield is referred to as a dark space. During processing of the substrate for high pressure processes (>100 mTorr), contaminants, such as outgassing particles, may flow into the dark space, causing unwanted arcing.

Therefore, the inventors have provided improved process kits for use in plasma process chambers.

SUMMARY

Embodiments of process shields for use in process chambers are provided herein. In some embodiments, a process shield for use in a process chamber includes: an annular body having an upper portion and a lower portion extending downward and radially inward from the upper portion, wherein the upper portion includes a plurality of annular trenches on an upper surface thereof and having a plurality of slots disposed therebetween to fluidly couple the plurality of annular trenches, wherein one or more inlets extend from an outer surface of the annular body to an outermost trench of the plurality of annular trenches.

In some embodiments, a process kit for use in a process chamber includes: a process shield having an upper portion and a lower portion extending downward and radially inward from the upper portion, wherein the upper portion includes a plurality of annular trenches on an upper surface thereof and having a plurality of slots disposed therebetween to fluidly couple the plurality of annular trenches, wherein one or more inlets extend from an outer surface of the process shield to an outermost trench of the plurality of annular trenches; and a cover ring having an annular body disposed on the process shield.

In some embodiments, a process chamber includes: a chamber body having an interior volume therein; a substrate support disposed in the interior volume; a target disposed in the interior volume opposite the substrate support to at least partially define a process volume therebetween; a process shield disposed about the substrate support and the target to define an outer boundary of the process volume, wherein the process shield and the target define a dark space gap therebetween, and wherein the process shield includes a plurality of annular trenches with a plurality of slots disposed therebetween to fluidly couple the plurality of annular trenches to the dark space gap; and an isolator ring disposed between the target and the process shield.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
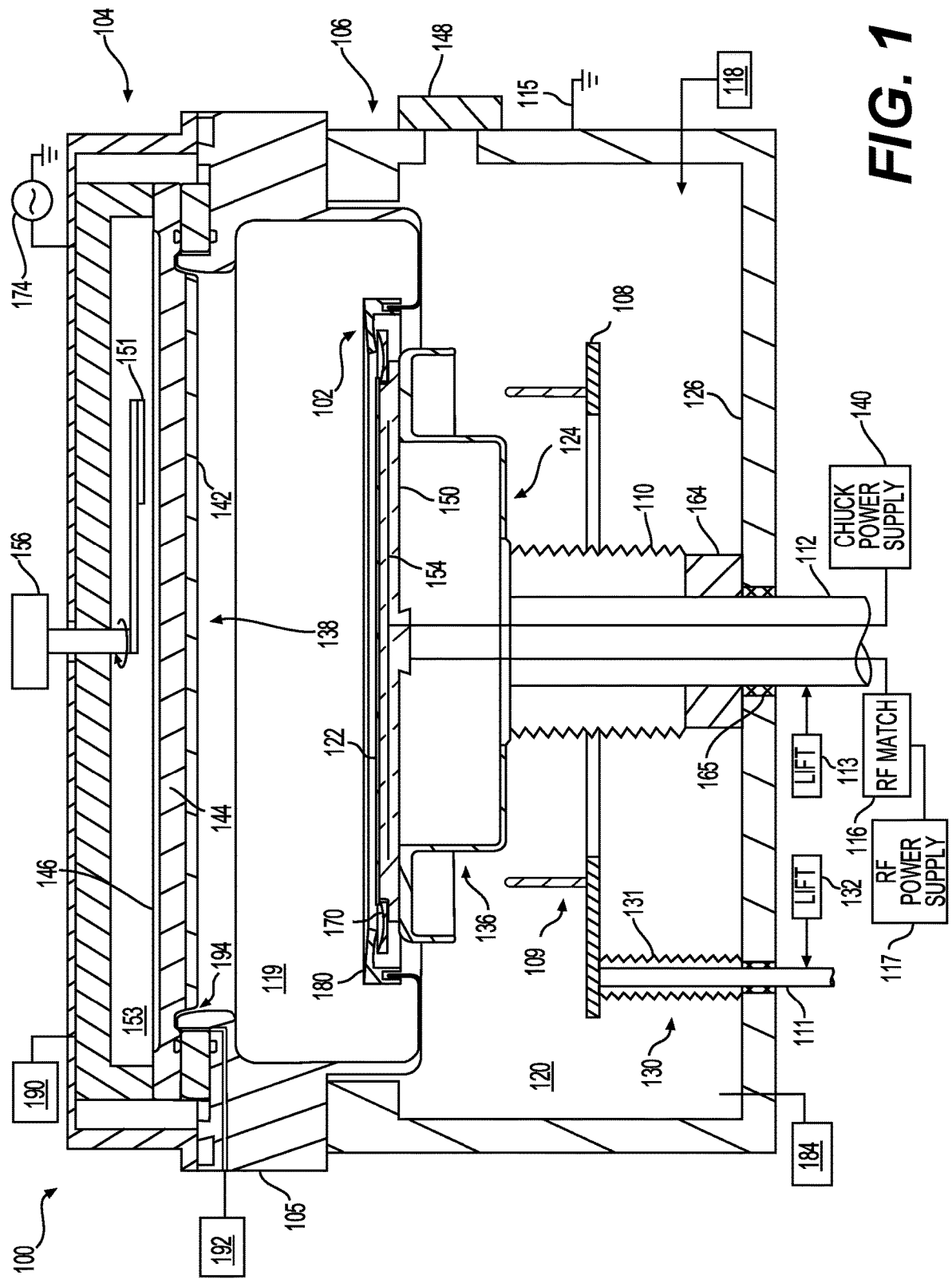
FIG. 1 depicts a schematic side view of a process chamber having a process kit in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits for use in process chambers are provided herein. The process kit includes a process shield disposed about a target of the process chamber to prevent unwanted deposition of the target material on chamber walls. A space between the target and the process shield is referred to as a dark space. The embodiments of process shields provided herein advantageously include a plurality of gas channels for flowing a gas therethrough to the dark space, creating a gas curtain that prevents contaminants from flowing into the dark space and causing unwanted arcing. The gas may be a purge gas or one or more process gases. Where the gas comprises one or more process gases, the plurality of gas channels advantageously provide improved uniformity of gas distribution into the process chamber.

FIG. 1 depicts a schematic side view of a process chamber 100 (e.g., a plasma processing chamber) having a process kit in accordance with at least some embodiments of the present disclosure. In some embodiments, the process chamber 100 is a PVD (physical vapor deposition) processing chamber for reactive processes. However, other types of processing chambers configured for different processes can also use or be modified for use with embodiments of the process kits described herein.

The process chamber 100 is a vacuum chamber which is suitably adapted to maintain sub-atmospheric pressures within an interior volume 120 during substrate processing. In some embodiments, the process chamber 100 is suitable for substrate processing at pressures of about 1 mTorr to about 400 mTorr. In some embodiments, the process chamber 100 is suitable for substrate processing at pressures of about 150 mTorr to about 350 mTorr. The process chamber 100 includes a chamber body 106 covered by a lid assembly 104 which encloses a processing volume 119 located in the upper half of the interior volume 120. The chamber body 106 and lid assembly 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise an electrostatic chuck 150 disposed on a pedestal 136 and a hollow support shaft 112 for supporting the pedestal 136 and the electrostatic chuck 150. The electrostatic chuck 150 comprises a dielectric plate having one or more electrodes 154 disposed therein. The pedestal 136 is generally made of a metal such as aluminum. The pedestal 136 is biasable and can be maintained at an electrically floating potential or grounded during plasma operation. The hollow support shaft 112 provides a conduit to provide, for example, backside gases, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of process chamber 100 to provide a flexible seal that allows vertical motion of the electrostatic chuck 150 while preventing loss of pressure from within the process chamber 100. The bellows assembly 110 also includes a lower bellows flange 164 in contact with an o-ring 165 or other suitable sealing element which contacts the bottom surface 126 to help prevent loss of chamber pressure.

The hollow support shaft 112 provides a conduit for coupling a chuck power supply 140 and RF sources (e.g., RF power supply 174 and RF bias power supply 117) to the electrostatic chuck 150. In some embodiments, the RF power supply 174 and RF bias power supply 117 are coupled to the electrostatic chuck 150 via respective RF match networks (only RF match network 116 shown). In some embodiments, the substrate support 124 may alternatively include AC or DC bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The platform 108 may be in the form of a hoop lift. The electrostatic chuck 150 may include through holes to receive the lift pins 109. A bellows assembly 131 is coupled between the substrate lift 130 and bottom surface 126 to provide a flexible seal which maintains the chamber pressure during vertical motion of the substrate lift 130.

A target 138 is disposed in the processing volume 119 opposite the substrate support 124 to at least partially define the processing volume 119 therebetween. The substrate support 124 has a support surface having a plane substantially parallel to a sputtering surface of the target 138. In some embodiments, the target 138 is made of titanium, tantalum, or aluminum. The target 138 is connected to one or both of a DC power source 190 and/or the RF power supply 174. The DC power source 190 can apply a bias voltage to the target 138 relative to the process shield 105.

The target 138 comprises a sputtering plate 142 mounted to a backing plate 144. The sputtering plate 142 comprises a material to be sputtered onto the substrate 122. The backing plate 144 is made from a metal, such as, for example, stainless steel, aluminum, copper-chromium or copper-zinc. The backing plate 144 can be made from a material having a thermal conductivity that is sufficiently high to dissipate the heat generated in the target 138, which form from eddy currents that arise in the sputtering plate 142 and the backing plate 144 and also from the bombardment of energetic ions from generated plasma onto the sputtering plate 142. In some embodiments, the backing plate 144 includes a recess 146 on a side opposite the sputtering plate 142.

In some embodiments, the process chamber 100 includes a magnetic field generator 156 to shape a magnetic field about the target 138 to improve sputtering of the target 138. The capacitively generated plasma may be enhanced by the magnetic field generator 156 in which, for example, a plurality of magnets 151 (e.g., permanent magnet or electromagnetic coils) may provide a magnetic field in the process chamber 100 that has a rotating magnetic field having a rotational axis that is perpendicular to the plane of the substrate 122. The process chamber 100 may, in addition or alternatively, comprise a magnetic field generator 156 that generates a magnetic field near the target 138 to increase an ion density in the processing volume 119 to improve the sputtering of the target material. The plurality of magnets 151 may be disposed in a cavity 153 in the lid assembly 104. A coolant such as water may be disposed in or circulated through the cavity 153 to cool the target 138.

The process chamber 100 includes a process kit 102 circumscribing various chamber components to prevent unwanted reaction between such components and ionized process material. The process kit 102 includes a process shield 105 surrounding the substrate support 124 and the target 138 to at least partially define the processing volume 119. For example, the process shield 105 may define an outer boundary of the processing volume 119. An outer peripheral surface of the target 138 and the process shield 105 define a dark space gap 194 therebetween. The dark space gap 194 is configured to prevent arcing between the target 138 and the process shield 105. In some embodiments, the process shield 105 is made of a metal such as aluminum. In some embodiments, the process kit 102 includes a deposition ring 170 that rests on an outer edge of the electrostatic chuck 150. In some embodiments, the process kit 102 includes a cover ring 180 disposed on the process shield 105 to form a tortuous gas flow path therebetween.

The process chamber 100 is coupled to and in fluid communication with a vacuum system 184 which includes a throttle valve (not shown) and a pump (not shown) which are used to exhaust the process chamber 100. The pressure inside the process chamber 100 may be regulated by adjusting the throttle valve and/or pump. A slit valve 148 may be coupled to the chamber body 106 and aligned with an opening in a sidewall of the chamber body 106 to facilitate transferring the substrate 122 into and out of the chamber body 106.

The process chamber 100 is coupled to a first gas supply 192 configured to supply one or more gases through the process shield 105 and into the dark space gap 194 to advantageously create a gas curtain, preventing outgassing from the substrate 122 during processing to enter the dark space gap 194 and cause unwanted arcing. The first gas supply 192 may supply a purge gas or one or more process gases. In some embodiments, the first gas supply 192 may supply nitrogen gas, argon gas, or oxygen gas. In some embodiments, the process chamber 100 may also be coupled to and in fluid communication with a second gas supply 118 which may supply one or more process gases to the process chamber 100 from a lower portion of the chamber body 106 (i.e., below the substrate 122) for processing the substrate 122 disposed therein. For example, the first gas supply 192 may provide nitrogen gas or oxygen gas while the second gas supply 118 provides argon gas.

In use, while the DC power source 190 supplies power to the target 138 and other chamber components connected to the DC power source 190, the RF power supply 174 energizes the sputtering gas (e.g., from the first gas supply 192 or the second gas supply 118) to form a plasma of the sputtering gas. The plasma formed impinges upon and bombards the sputtering surface of the target 138 to sputter material off the target 138 onto the substrate 122. In some embodiments, RF energy supplied by the RF power supply 174 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. An additional RF power source, (e.g., RF bias power supply 117) can also be used to supply a bias voltage to the substrate support 124 to attract ions form the plasma towards the substrate 122.

Figure 2:
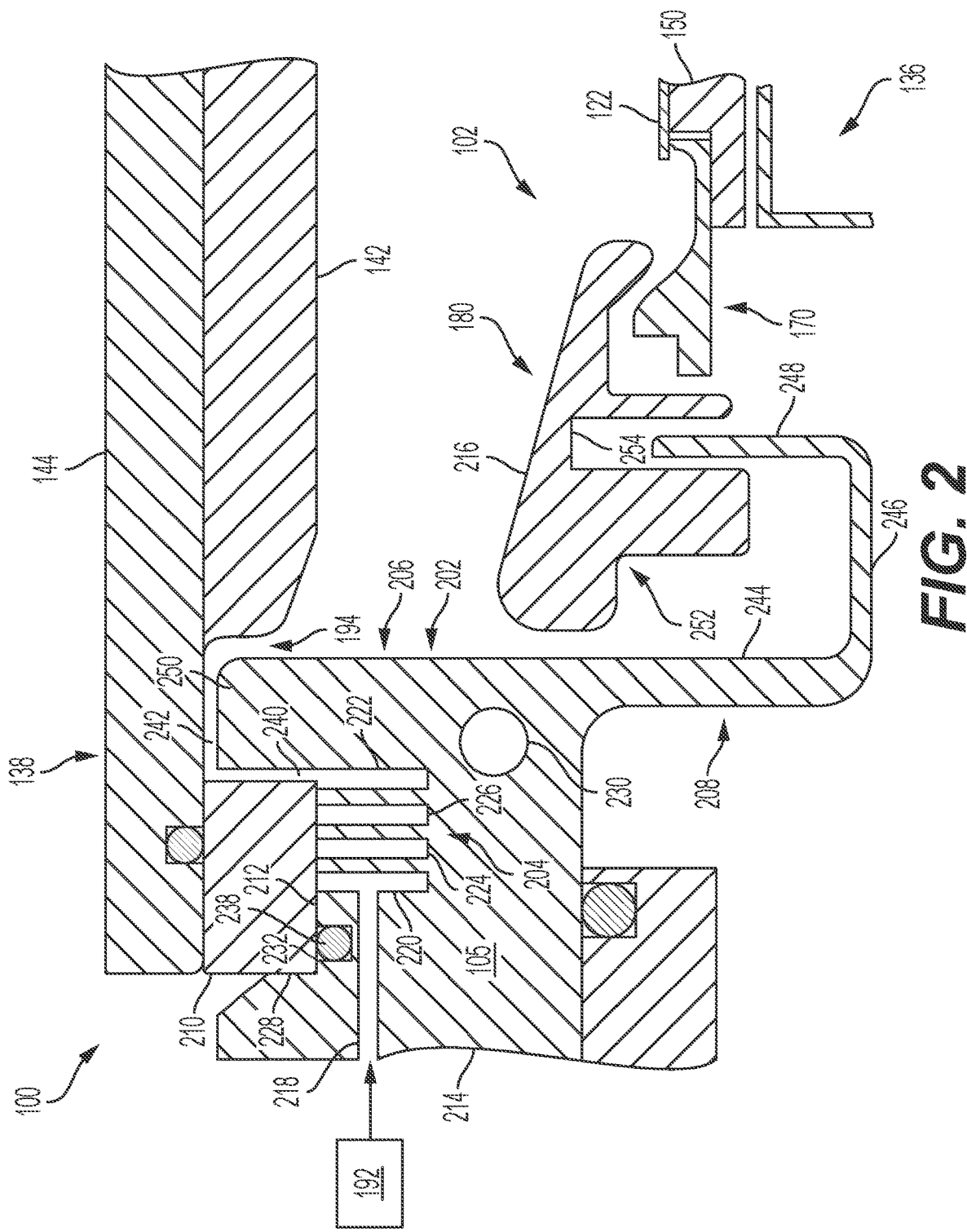
FIG. 2 depicts a schematic top view of a process shield in accordance with at least some embodiments of the present disclosure.

FIG. 2 depicts a cross-sectional side view of a portion of a process chamber having a process kit in accordance with at least some embodiments of the present disclosure. The process kit 102 includes a process shield 105 generally having an annular body 202 that includes an upper portion 206 and a lower portion 208 extending downward and radially inward from the upper portion 206. In some embodiments, the upper portion 206 includes a coolant channel 230 to circulate a coolant therethrough to cool the process shield 105.

An isolator ring 210 is disposed between the target 138 and the process shield 105. In some embodiments, an upper surface 212 of the upper portion 206 includes a recess 228 to accommodate the isolator ring 210. In some embodiments, the upper portion 206 includes a plurality of annular trenches 204 on the upper surface 212 thereof. In some embodiments, the plurality of annular trenches 204 extend downward from the recess 228. In some embodiments, the upper portion 206 includes an o-ring groove 232 radially outward of the plurality of annular trenches 204 to accommodate an o-ring 238 or other suitable sealing gasket to provide a seal between the isolator ring 210 and the process shield 105.

The process shield 105 includes one or more inlets 218 that extend from an outer surface 214 of the process shield 105 to an outermost trench 220 of the plurality of annular trenches 204. The one or more inlets 218 are fluidly coupled to first gas supply 192 to supply gas from the first gas supply 192 to the plurality of annular trenches 204. The process shield 105 includes a plurality of slots (discussed below with respect to FIG. 3) to fluidly couple the plurality of annular trenches 204 and provide a gas flow path from the one or more inlets 218 to an innermost trench 222.

In some embodiments, the plurality of annular trenches 204 include a second trench 224 and a third trench 226 disposed between the outermost trench 220 and the innermost trench 222. In some embodiments, each trench of the plurality of annular trenches 204 have a width of about 0.05 inches to about 0.2 inches. In some embodiments, each trench of the plurality of annular trenches 204 have a depth of about 0.3 inches to about 0.4 inches. While FIG. 2 depicts the plurality of annular trenches 204 comprising four trenches, the plurality of annular trenches 204 may include more than four trenches or less than four trenches. In some embodiments, all of the trenches of the plurality of annular trenches 204 are disposed directly beneath the isolator ring 210 except for the innermost trench 222. In some embodiments, all trenches of the plurality of annular trenches 204 have a substantially similar width and depth. In some embodiments, substantially similar or about may be within about 10 percent.

Figure 3:
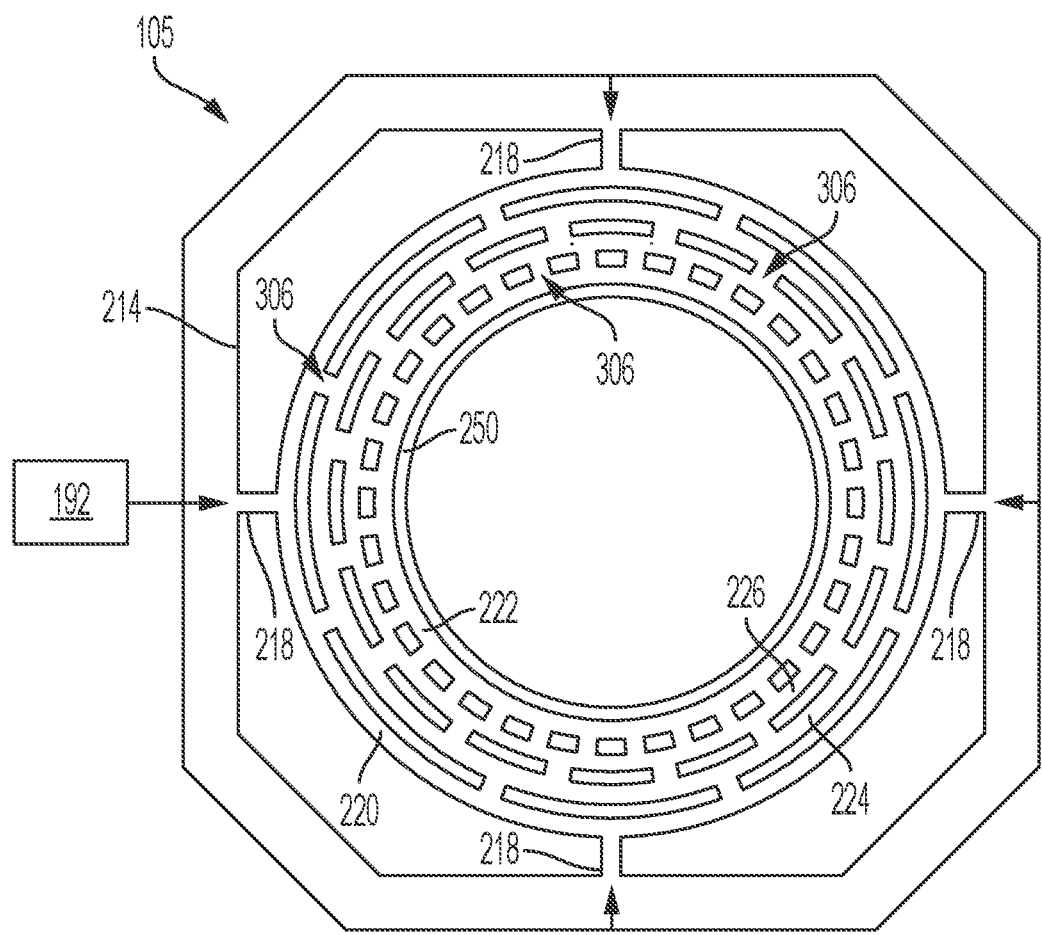
FIG. 3 depicts a cross-sectional side view of a portion of a process chamber having a process kit in accordance with at least some embodiments of the present disclosure.

FIG. 3 depicts a schematic top view of a process shield 105 in accordance with at least some embodiments of the present disclosure. The first gas supply 192 is fluidly coupled to the one or more inlets 218. In some embodiments, the one or more inlets 218 comprise four inlets that extend to the outermost trench 220. The process shield 105 includes a plurality of slots 306 between each of the plurality of annular trenches 204 to fluidly couple the outermost trench 220 to the innermost trench 222. In some embodiments, an inner ring 250 of the process shield 105 disposed radially inward of the innermost trench 222 has a continuous processing volume facing surface.

In some embodiments, the plurality of slots 306 are arranged such that they provide a substantially equal flow path from the one or more inlets 218 to the innermost trench 22. In some embodiments, the plurality of slots 306 between adjacent ones of the plurality of annular trenches 204 increase in number from the outermost trench 220 to the innermost trench 222. In some embodiments, the plurality of slots 306 double between adjacent ones of the plurality of annular trenches 204 from the outermost trench 220 to the innermost trench 222.

For example, in some embodiments, the plurality of slots 306 include eight slots between the outermost trench 220 and the second trench 224. In some embodiments, the eight slots between the outermost trench 220 and the second trench 224 are disposed at regular intervals. In some embodiments, the plurality of slots 306 include sixteen slots between the second trench 224 and the third trench 226. In some embodiments, the sixteen slots between the second trench 224 and the third trench 226 are disposed at regular intervals. In some embodiments, the plurality of slots 306 include thirty-two slots between the third trench 226 and the innermost trench 222. In some embodiments, the thirty-two slots between the third trench 226 and the innermost trench 222 are disposed at regular intervals.

Referring back to FIG. 2, a first gap 240 is disposed between an inner surface of the isolator ring 210 and an outer surface of the inner ring 250 of the upper portion 206 (i.e., opposing surface of the process shield 105). The first gap 240 is fluidly coupled to the innermost trench 222. For example, the first gap 240 may be disposed above the innermost trench 222 such that an open bottom portion of the first gap 240 is coincident with at least a portion of an open top portion of the innermost trench 222. In some embodiments, the first gap 240 has a width that is less than a width of the innermost trench 222. In some embodiments, the first gap is about 0.02 inches to about 0.1 inches. A second gap 242 is disposed between an upper surface of the inner ring 250 and the target 138. The dark space gap 194 is disposed between an inner surface of the inner ring 250 and the target 138. A flow path extends from the first gas supply 192 through the one or more inlets 218, through the plurality of annular trenches 204, through the first gap 240, through the second gap 242, through the dark space gap 194 and into the processing volume 119. The first gap 240 is maintained at a substantially uniform distance about the process shield 105 to advantageously provide more uniform gas distribution into the processing volume 119, and hence more uniform mixing of the gas provided by the first gas supply 192 and the target material. In embodiments where the first gap 240 has a width that is less than a width of the innermost trench 222, the first gap 240 provides a flow restriction that advantageously provides more uniform gas distribution into the processing volume 119, and hence more uniform mixing of the gas provided by the first gas supply 192 and the target material.

In some embodiments, the lower portion 208 includes a first leg 244 extending downward from the upper portion 206. In some embodiments, the lower portion 208 includes a first ledge 246 extending radially inward from the first leg 244. In some embodiments, the lower portion 208 includes an inner lip 248 extending upward from the first ledge 246. In some embodiments, the first leg 244 has no through holes. In some embodiments, the inner lip 248 has no through holes.

In some embodiments, the cover ring 180 is disposed on the process shield 105. The cover ring 180 generally includes an annular body 252 having a lower groove 254 on a lower surface thereof to accommodate the inner lip 248. In some embodiments, the inner lip 248 and the lower groove 254 form a tortuous gas flow path. In some embodiments, an upper surface 216 of the cover ring 180 inclines radially downward and inward. The cover ring 180 and the deposition ring 170 form a tortuous gas flow path therebetween.

Figure 4:
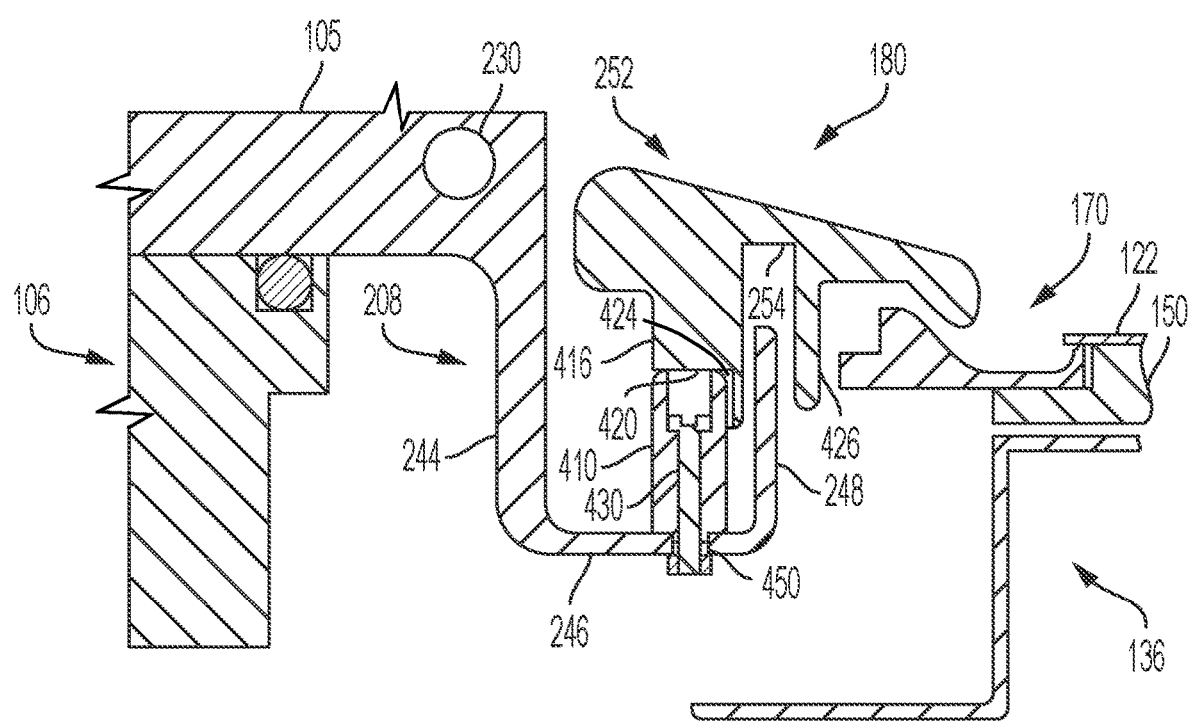
FIG. 4 depicts a cross-sectional side view of a portion of a process chamber having a process kit in accordance with at least some embodiments of the present disclosure.

FIG. 4 depicts a cross-sectional side view of a portion of a process chamber having a process kit in accordance with at least some embodiments of the present disclosure. In some embodiments, one or more centering bushings 410 are coupled to the process shield 105 to center the cover ring 180 to the process shield 105. In some embodiments, the cover ring 180 includes an outer leg 416 and an inner leg 426 extending downward from the annular body 252 on either side of the lower groove 254. In some embodiments, the outer leg 416 includes one or more slots 420 for accommodating the one or more centering bushings 410. In some embodiments, the one or more centering bushings 410 comprise three bushings. In some embodiments, the one or more centering bushings 410 are disposed at regular intervals. In some embodiments, the one or more centering bushings 410 are coupled to the process shield 105 via fasteners 430. In some embodiments, the one or more centering bushings 410 extend into openings 450 in the first ledge 246.

In some embodiments, the one or more centering bushings 410 have rounded upper surfaces. In some embodiments, the one or more slots 420 have angled sidewalls 424. In some embodiments, the angled sidewalls of the one or more slots 420 extend downward and outward at an angle of about 5 degrees to about 15 degrees. The angled sidewalls of the one or more slots 420 and the rounded upper surfaces of the one or more centering bushings 410 advantageously enables repeatable concentric placement and allows for concentric thermal expansion of the cover ring 180 with respect to the process shield 105. In some embodiments, the one or more centering bushings 410 have a diameter of about 0.3 to about 0.5 inches to advantageously minimize disruptions of the tortuous gas flow path between the process shield 105 and the cover ring 180.

While the foregoing is directed to embodiments of the present disclosure, other and further embodiments of the disclosure may be devised without departing from the basic scope thereof.

The invention claimed is:

1. A process shield for use in a process chamber, comprising:

an annular body having an upper portion and a lower portion extending downward and radially inward from the upper portion, wherein the upper portion includes a plurality of annular trenches on an upper surface thereof and having a plurality of slots disposed therebetween to fluidly couple the plurality of annular trenches, wherein one or more inlets extend from an outer surface of the annular body to an outermost trench of the plurality of annular trenches, and wherein the upper surface of the annular body includes a recess to accommodate an isolator ring, and the plurality of annular trenches extend downward from a bottom surface of the recess.

2. The process shield of claim 1, wherein the plurality of slots between adjacent ones of the plurality of annular trenches increase in number from the outermost trench to an innermost trench.

3. The process shield of claim 2, wherein the plurality of annular trenches include a second trench and a third trench disposed between the outermost trench and the innermost trench, and wherein the plurality of slots include eight slots between the outermost trench and the second trench, sixteen slots between the second trench and the third trench, and thirty-two slots between the third trench and the innermost trench.

4. The process shield of claim 1, wherein the one or more inlets comprise four inlets.

5. The process shield of claim 1, wherein the upper portion includes a coolant channel.

6. The process shield of claim 1, wherein the plurality of annular trenches have a width of about 0.05 inches to about 0.2 inches.

7. The process shield of claim 1, wherein the upper portion includes an o-ring groove radially outward of the plurality of annular trenches.

8. The process shield of claim 1, wherein the lower portion includes a first leg extending downward from the upper portion, a first ledge extending radially inward from the first leg and an inner lip extending upward from the first ledge, wherein the first leg has no through holes.

9. A process kit for use in a process chamber, comprising:

a process shield having an upper portion and a lower portion extending downward and radially inward from the upper portion, wherein the upper portion includes a plurality of annular trenches on an upper surface thereof and having a plurality of slots disposed therebetween to fluidly couple the plurality of annular trenches, wherein one or more inlets extend from an outer surface of the process shield to an outermost trench of the plurality of annular trenches, and an inner ring of the process shield disposed radially inward of an innermost trench of the plurality of annular trenches has a continuous processing volume facing surface; and a cover ring having an annular body disposed on the process shield.

10. The process kit of claim 9, further comprising one or more centering bushings coupled to the process shield to center the cover ring to the process shield.

11. The process kit of claim 10, wherein the cover ring includes an outer leg and an inner leg extending downward from the annular body, and wherein the outer leg includes one or more slots for accommodating the one or more centering bushings.

12. The process kit of claim 10, wherein the one or more centering bushings comprise three bushings.

13. The process kit of claim 9 wherein the plurality of slots between adjacent ones of the plurality of annular trenches increase in number from the outermost trench to an innermost trench.

14. A process chamber, comprising:
a chamber body having an interior volume therein;
a substrate support disposed in the interior volume;
a target disposed in the interior volume opposite the substrate support to at least partially define a process volume therebetween;
a process shield disposed about the substrate support and the target to define an outer boundary of the process volume, wherein the process shield and the target define a dark space gap therebetween, and wherein the process shield includes a plurality of annular trenches with a plurality of slots disposed therebetween to fluidly couple the plurality of annular trenches to the dark space gap; and
an isolator ring disposed between the target and the process shield, and a gas flow path extending between an inner sidewall of the isolator ring and an outer sidewall of the process shield adjacent an innermost of the plurality of annular trenches.

15. The process chamber of claim 14, further comprising a first gas supply for flowing one or more gases from the first gas supply through the plurality of annular trenches to the dark space gap.

16. The process chamber of claim 14, wherein the process shield includes a recess on an upper surface thereof, wherein the plurality of annular trenches extend from the recess, and wherein the isolator ring is disposed in the recess.

17. The process chamber of claim 14, further comprising a cover ring disposed on the process shield and one or more centering bushings coupled to the process shield to center the cover ring to the process shield.

18. The process chamber of claim 14, wherein the process shield includes a coolant channel configured to flow a coolant therethrough.

19. The process chamber of claim 14, wherein a gap between an inner surface of the isolator ring and an opposing surface of the process shield is about 0.02 inches to about 0.1 inches.

* * * * *